United States Patent [19]

Wakabayashi et al.

[11] 4,371,250
[45] Feb. 1, 1983

[54] DEVELOPING PROCESSOR FOR PRINTING PLATES HAVING A SPRAY TUBE DEVELOPER AGITATOR

[75] Inventors: Masayoshi Wakabayashi; Matsuyoshi Taniguchi, both of Shiga, Japan

[73] Assignee: Dainippon Screen Manufacturing Co., Ltd., Kyoto, Japan

[21] Appl. No.: 309,501

[22] Filed: Oct. 6, 1981

[30] Foreign Application Priority Data

Oct. 7, 1980 [JP] Japan .................. 55-143830[U]

[51] Int. Cl.³ .......................................... G03D 3/04
[52] U.S. Cl. .................................. 354/325; 354/328; 366/167; 118/419
[58] Field of Search ............ 354/320, 321, 322, 324, 354/325, 328; 366/167, 173; 118/313, 314, 315, 316, 419, 429

[56] References Cited

U.S. PATENT DOCUMENTS

| | | | |
|---|---|---|---|
| 3,589,261 | 6/1971 | Krikelis | 354/322 |
| 4,148,576 | 4/1979 | Martino | 354/325 |
| 4,181,421 | 1/1980 | Kitrosser | 354/322 |

*Primary Examiner*—Joseph W. Hartary
*Assistant Examiner*—Alan Mathews
*Attorney, Agent, or Firm*—Armstrong, Nikaido, Marmelstein & Kubovcik

[57] ABSTRACT

Disclosed is an improved processor for printing plates or the like which essentially comprises a lower disposed developer receptacle containing a developer therein and upper disposed spray pipes and in which an arrangement is made such that a presensitized plate for printing or the like to be processed is initially passed through the developer receptacle and then subjected to treatment with the developer sprayed from the spray pipes.

4 Claims, 1 Drawing Figure

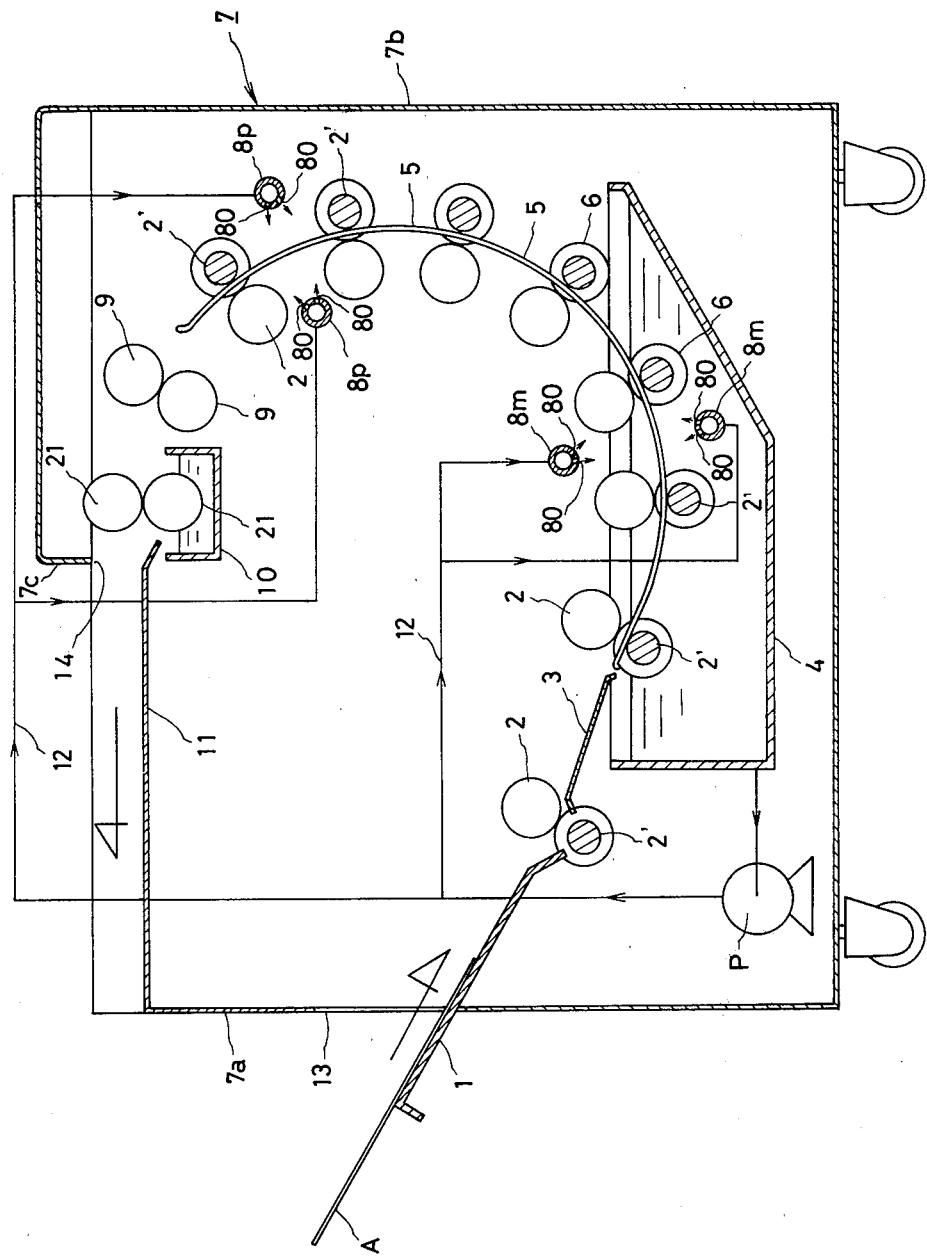

DEVELOPING PROCESSOR FOR PRINTING PLATES HAVING A SPRAY TUBE DEVELOPER AGITATOR

FIELD OF THE INVENTION

The present invention relates to a processor for preparation of printing plates or the like, and more particularly, it relates to an improved printing plate processor which is smaller in the overall structural size and more compact than existing processors and with which development of exposed plates for printing or the like can be processed without an unevenness generated on the processed surface unlike existing comparable processors.

BACKGROUND OF THE INVENTION

Conventional processors for preparation of for example a printing plate include such ones of which the system is such that an exposed material to be processed is soaked in a developer received in a relatively shallow developer tank and also such ones according to the system of which the developer is sprayed by means of a spray tube or tubes.

With the former processors (that is, developer-tank system processors), it is feasible to render sufficiently wetted the emulsion surface of for example a material printing plate to be treated, but a difficulty is encountered such that unevenness is likely to be generated if the developer fails to be sufficiently agitated in the developer tank. Then, with the latter (spray-tube system processors), although the problem of generation of unevenness, namely uneven effect of development, can be effectively obviated inasmuch as the developer is spray-applied, it on the other hand is unavoidable to provide a number of spray pipes or tubes in the processor in order to effect a sufficient application of the developer onto the emulsion surface and thereby have the surface sufficiently wetted, and a difficulty in this case is therefore that the processor has to be relatively large in size as a whole and can hardly be made compact.

Accordingly, it is a primary object of the present invention to provide an improved processor for printing plates or the like which is smaller in size and more compact than conventional comparable machines and with which the problem of generation of unevenness had with existing machines is effectively eliminated.

It also is an object of the invention to provide a processor for printing plates or the like which is easier to operate than conventional processors.

SUMMARY OF THE INVENTION

The above and other objects of the present invention are achieved in the embodiment illustrated and described herein by the provision of such a processor for printing plates or the like which essentially is characterized in that it includes a relatively shallow developer tank disposed at a bottom portion within a machine housing and a spray tube or tubes arranged above the developer tank and adapted to jet or spray the developer onto the plate for printing or the like to be processed, and also in such an arrangement in which the plate to be processed is passed initially through the developer tank and is then subjected to a treatment with the developer spray-applied through the spray tube or pipe. On account of the above features in structure and arrangement, the machine of the present invention can be structured smaller in the overall size and more compact than conventional machines and yet can be operated free of the difficulty of uneven developing performance or generation of unevenness.

The improved processor according to the present invention is also characterized in that it has provided on a same side thereof a charging opening and a discharging opening respectively for the material plate to be processed and for the processed plate, whereby the developing operation can be markedly facilitated.

BRIEF DESCRIPTION OF THE DRAWINGS

Some of the features of the present invention having been stated, other features and advantages of the invention will appear as the description proceeds, when taken in connection with the accompanying drawing:

The single FIGURE of the drawing shows a schematic sectional view of a processor for printing plates or the like embodying the present invention.

DESCRIPTION OF THE ILLUSTRATED EMBODIMENT

The present invention will now be described in connection with the embodiment illustrated in the drawing, in which the reference numeral 7 represents a box-like machine housing of a generally square sectional configuration, which has a charging or feeding opening 13 through which an exposed material to be processed such as a plate for printing or the like is fed into the machine, provided at a central portion in height of a side wall 7a (on the left side in the drawing) of the housing 7.

Through the feed opening 13, a corrugated guide plate 1 is mounted at an angle of about 40° relative to horizon for slidably feeding along the upper surface thereof the material plate to be processed indicated at A, which is by way of example a presensitized plate, namely a printing plate, comprising for example a flexible aluminum plate of a thickness of the order of 0.3 mm. Hereinafter, references of the material plate A will be limited only to a presensitized plate (herein referred to as PS plate), but this is solely for clarity in description and not in any limitative sense.

The corrugated guide plate 1 is applied on its upper surface with a slide-aid tape or sheet so as to facilitate the slidable transfer of the PS plate A and also for preventing the plate A from being accidentally impaired by for example scratch. Further, the guide plate 1 has a top or outer end portion protruded out of the opening 13, beyond the side wall 7a of the housing 7, and for example it may be connected to an exposure machine. The bottom or inner end of the guide plate is located within the machine housing 7.

Within the housing 7, there are disposed a number of pairs of feed rollers 2 and 2' having peripheral surfaces made of rubber for example (7 pairs are provided in the illustrated embodiment). These rollers are driven to rotate by a motor (not shown) and transfer the PS plate A fed along the guide plate 1 into and through a developer tank later to be described and further between a pair or pairs of oppositely mounted spray tubes or pipes also to be described later. The plurality of pairs of feed rollers 2 and 2' are so arranged as to altogether provide a U-turn curved path of transfer of the plate A. This arrangement is made so that when processed, the plate A can be eventually sent out and taken out through a discharging opening provided at the same side of the machine housing 7 as the feed opening 13. On the outer periphery of the one of each pair of rollers, indicated at 2', a plurality of circumferential grooves 6 are formed at suitable intervals in the axial direction of the roller, and in the grooves 6, there are received guide members 5 made of a bar steel or wire curved in accordance with the abovementioned U-turn curved arrangement of the pairs of rollers 2 and 2'. Guide members 5 are suitably spaced in the direction perpendicular to the plane of the drawing sheet (that is, the axial direction of rollers 2 and 2') alike the circumferential grooves 6, and are so arranged as to be not causative of any disturbance in the carrying out of development of the underside or rearside of the plate A made by spraying the developer from the convex side of the curved arrangement of guide members 5. Further, guide members 5 are integrally connected at their ends and removably supported by walls of the machine housing 7.

At a bottom portion within the housing 7, the before referred to developer tank is disposed, which is indicated at 4 and which may comprise a pan- or dish-like receptacle of a relatively small depth, disposed to be horizontal. The tank 4 is open at its top and can recover therein the drainage portion of the developing solution sprayed out of spray tubes or pipes later to be described. Thus, according to the present invention it can be effectively dispensed with to provide a particular receptacle exclusively for recovering of the sprayed developer.

Disposed between the corrugated guide plate 1 and the developer tank 4 and indicated at 3 is a bridging guide member. Also, substantially within the tank 4 there are disposed a plurality of pairs of rollers 2 and 2', which are disposed in the number of 3 pairs in the illustrated embodiment. These pairs of rollers will guide the plate A delivered along the bridging guide 3, into and through the developer received within the tank 4, whereby the plate A can be sufficiently immersed and soaked in the developer and its emulsion surface can be sufficiently wetted.

At an upper position within the machine housing 7, adjacent another side wall 7b and above the developer tank 4, there are disposed the before referred to spray pipes or tubes, which are indicated at 8p and which are provided in a single pair in the illustrated embodiment. The pair of spray tubes 8p and 8p extend on horizontal planes and are suitably spaced from each other, providing an open space through which the PS plate A passed through the developer tank 4 can pass. Further, the tubes 8p and 8p are connected to the tank 4 through pipe lines 12 and a pump P, and by the function of the pump P, the developer is delivered under pressure from the tank 4 to the tubes. Each tube 8p is provided with a number of jet openings or holes 80, through which the developer is spray-applied onto the emulsion surface of the PS plate A which was previously wetted through the developer tank 4. By the injection application of the developer as above, a defectless development can be performed. As before stated, the sprayed drainage portion of the developer is recovered in the tank 4.

In the processor according to the present invention, the plate A has already been sufficiently wetted before it reaches the location of spray pipes 8p as above mentioned, so that the necessity is eliminated in this case of effecting a sufficient wetting with the sprayed developer which is indispensable with the existing spray-tube system processors. That is to say, with the processor of the present invention, advantageously reduced is the amount to be sprayed of the developer. In other words, in the processor of the invention, only less can be the number of spray tubes in comparison to conventional processors.

Further, according to the present invention it is also proposed to mount another pair of spray tubes or pipes 8m and 8m, of which one is disposed horizontally in the developer tank 4, while the other being disposed also horizontally but above the liquid level of the developer within the tank 4. Similar to the before described spray pipes 8p, these agitation spray pipes 8m, too, are connected to the developer tank 4 through the pipe lines 12 and the pump P and receive supply of the developer, under pressure. Also, each agitation spray tube 8m again is provided with a number of jet holes 80 at prescribed points thereof. The developer within the tank 4 can be desirably agitated and its concentration can be desirably homogenized by way of appropriately differentiating spray directions of the developing solution, between the two agitation spray pipes 8m and 8m (this will be readily done by rotating the pipes). That is to say, it may be devised, for example, that while a first pipe 8m is made having in combination a vertical spray direction and another spray direction which is inclined at about 45° relative to the vertical direction, another pipe 8m is made having in combination a vertical spray direction crossing the about 45° inclined spray direction of the first pipe and another spray direction which is inclined at about 45° relative to the last mentioned vertical spray direction and crossing the vertical direction of the first pipe. By the provision of the above arrangement, it no longer is required to provide a particular agitator within the tank 4.

Further, if a single agitation spray pipe 8m alone is employed as provided within the tank 4, it may be feasible to have the developer agitated within the tank because of the pressure under which the developer is jetted through the pipe. However, by providing another spray pipe 8m above the developer surface as in the illustrated embodiment, an enhanced effect of agitation can be obtained. In the case of the provision of a single agitation spray tube in the tank as mentioned above, further, it may well be devised to provide jet holes 80 in a manner of being dispersed all around the periphery of the tube.

At a location adjacent the forward end of the path of transfer of the plate A, above the spray tubes 8p and 8p, there are disposed a pair of squeezee rollers 9 and 9 for removing the developer remaining present on the processed plate A passed between the spray tubes 8p.

Adjacent squeezee rollers 9, downstream of the rollers 9 in the direction of transfer of the plate A, there is equipped a gum solution reservoir 10, together with a pair of opposed coating rollers 21 and 21. The plate A sent out of the squeezee rollers 9 is passed between the coating rollers 21 and 21 and becomes coated with gum arabic.

On the outlet side of the gum-arabic solution reservoir 10, the before mentioned discharge or take-out opening is provided in a side wall 7c of an upper portion of the housing 7, and this opening is shown at 14. It will be apparent that the discharge opening 14 is on the same side of the machine or machine housing 7 as the feed opening 13, wherefore it is unnecessary for an operator or user of the processor to move around the machine to take out the processed plate A, and instead thereof, the operator can stay at the same position as he or she was at in feeding the plate A to be processed.

Outwardly extended from the location of the take-out opening 14 is a corrugated receiving plate 1, which forms a part of the upper wall of the housing 7. This receiving plate 11 resembles the previously described guide plate 1 in that it also is applied with a slide-aid sheet or tape on the upper surface thereof.

In operation of the processor of the present invention having the above described structural details and arrangements, a presensitized plate A to be processed may be put on the guide plate 1, and on account of its own weight as well as by the function of pairs of rollers 2 and 2' which are mutually inwardly rotated, it may then be slidably fed into the machine and into the developer tank 4. Suitably spaced pairs of rollers 2 and 2' will then carry the plate A along the curved guide members 5 in the U-shaped path within the machine housing 7, and the plate A becomes completely developed by the spray-application thereto of the developer by spray tubes 8$p$ and 8$p$ above the shallow developer tank 4. After it is squeezed by the pair of squeezee rollers 9, the plate A is sent out onto the receiving plate 11 provided at the same side of the machine as the feed guide plate 1.

As described in detail above, the present invention consists in a processor for printing plates or the like which in essence comprises a relatively shallow developer tank 4 disposed at a bottom location within a machine housing 7 and spray tubes 8$p$ disposed at a position above the tank 4 and in which the printing plate or the like to be processed is initially passed through the developer tank 4 and then subjected to a treatment with the developer jetted from spray tubes 8$p$, and it can therefore bring about the following advantages:

The surface of a printing plate or the like to be treated is preparatively wetted through the developer tank 4 and then is processed by spray-application of the developer through spray tubes or pipes 8$p$, so that the number of spray tubes can be effectively reduced, whereby the processor as a whole can be compact and yet generation of unevenness can be obviated.

Also, the developer tank 4 is open at its top, and drainage of the developer sprayed through tubes 8$p$ can be recovered in the tank 4 below the tubes, so that the processor mechanism can be simplified and compact as a whole of the processor.

Further, agitation spray tubes 8$m$ are provided in the liquid within the developer tank 4 and also at a position above the liquid surface, so that by differentiating the spray directions of the number of jet holes of the tubes between one tube 8$m$ and another tube 8$m$, the developer in the tank 4 can be desirably agitated to homogenize the concentration of the developing solution. Accordingly, it is unnecessary to provide a particular agitator.

Furthermore, both charging opening and discharge opening are provided on a same side of the machine housing 7, so that the necessity is negated of an operator or user of the processor to move around the machine, whereby development operation can be easified.

What is claimed is:

1. A developing processor for printing plates comprising:
    a machine housing,
    a relatively shallow developer tank disposed at a bottom portion within said housing and holding a developer therein,
    a spray tube provided within said housing above said developer tank and adapted to jet developer onto a printing plate to be processed, and
    an agitator spray tube having a number of jet holes and disposed in said developer held in said developer tank, said agitator spray tube being connected to said developer tank through a pipe line and a pump and adapted to agitate the developer in the developer tank,
    wherein an arrangement is made such that said printing plate to be processed is passed through said developer tank and then treated with the developer jetted from said spray tube.

2. A developing processor as claimed in claim 1, wherein said developer tank is open at its top and recovers the developer sprayed from said spray tube.

3. A developing processor for printing plates comprising:
    a machine housing,
    a relatively shallow developer tank disposed at a bottom portion within said housing and holding a developer therein,
    a spray tube provided within said housing above said developer tank and adapted to jet developer onto a printing plate to be processed, said developer tank being open at its top and adapted to recover the developer sprayed from said spray tube, and
    a pair of agitator spray tubes each having a number of jet holes and disposed to oppose each other with space therebetween of which one is disposed in said developer held in said developer tank, while the other being disposed above the surface of the developer in the developer tank, said agitator spray tubes being connected to said developer tank through a pipe line and a pump and adapted to agitate the developer in the developer tank, wherein an arrangement is made such that said printing plate to be processed is passed through said developer tank and then treated with the developer jetted from said spray tube.

4. A developing processor as claimed in claims 1 or 2, wherein said housing has on a same side thereof a charging opening and a discharging opening respectively for a printing plate to be processed and a processed printing plate.

* * * * *